(12) United States Patent
Ninomiya et al.

(10) Patent No.: US 6,721,910 B2
(45) Date of Patent: *Apr. 13, 2004

(54) SEMICONDUCTOR MEMORY IMPROVED FOR TESTING

(75) Inventors: Kazuhiro Ninomiya, Kawasaki (JP); Shinya Fujioka, Kawasaki (JP); Yasuharu Sato, Kawasaki (JP)

(73) Assignee: Fujitsu Limited, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/400,831

(22) Filed: Sep. 21, 1999

(65) Prior Publication Data

US 2003/0177424 A1 Sep. 18, 2003

(30) Foreign Application Priority Data

Sep. 22, 1998 (JP) .......................................... 10-268320

(51) Int. Cl.[7] .............................................. G11C 29/00

(52) U.S. Cl. ........................ 714/718; 327/276; 365/222

(58) Field of Search ................................. 714/718, 724, 714/719, 733, 738, 726, 728, 731, 721; 365/201, 189.7, 222, 230.03, 233, 190, 193, 194, 196, 236; 324/754, 130, 661, 758; 318/662; 327/233, 270, 271, 273, 276; 257/208, 532, 535

(56) References Cited

U.S. PATENT DOCUMENTS

| | | | | |
|---|---|---|---|---|
| 4,158,171 A | * | 6/1979 | Abbe et al. | 318/662 |
| 5,467,356 A | * | 11/1995 | Choi | 714/718 |
| 5,471,430 A | * | 11/1995 | Sawada et al. | 365/222 |
| 5,790,468 A | * | 8/1998 | Oh | 365/201 |
| 6,255,675 B1 | * | 7/2001 | Trimberger | 257/206 |

* cited by examiner

Primary Examiner—Guy J. Lamarre
(74) Attorney, Agent, or Firm—Arent Fox, PLLC

(57) ABSTRACT

A synchronous DRAM (SDRAM) or a fast cycle RAM (FCRAM) includes capacitors connected by switches to a signal wire. The switches are controlled to connect and disconnect the capacitors to the signal wire. In a test mode, the transmission time of a control signal is tested by connecting various combinations of the capacitors to the signal wire, and then measuring the signal timing. The signal timing of the memory device can be controlled by selecting which and how many of the capacitors are connected to the signal wire.

15 Claims, 7 Drawing Sheets

SEMICONDUCTOR MEMORY IMPROVED FOR TESTING

BACKGROUND OF THE INVENTION

Field of the Invention

The present invention relates to semiconductor memory devices and methods for testing semiconductor memory devices. More particularly, the present invention relates to a method for testing semiconductor memory devices, which are operated by acquiring external commands and external addresses synchronously with high frequency clock signals.

In recent synchronous dynamic random access memories (SDRAM), the cycle time (RAS cycle time) for acquiring external commands has been reduced to 60 nanoseconds. Such SDRAMs acquire external command signals in synchronism with clock signals and are operated at high speeds. More specifically, the conventional SDRAM acquires a row address simultaneously with an active command during a read/write operation. The SDRAM then acquires a column address simultaneously with an active command.

Since the recent SDRAMs use control signals (i.e., bit wire short signals, word wire latch signals, and sense amplifier latch signals) having shortened cycles, the transmission timing of the control signals must be accurate. Thus, the timing of the control signals is adjusted by employing an electron-beam (EB) tester to perform a focused ion beam (FIB) process.

The SDRAM undergoes various testing. For example, an internal refresh counter test is carried out on the SDRAM in accordance with the following procedures. First, when entering a counter test cycle in response to a test command, the row address indicated by the count value of the internal counter is accessed. This increments the value of the internal refresh counter. Test data is then written at a predetermined column address in response to a write command. The SDRAM then exits the counter test cycle. Afterward, the counter test cycle is entered again in response to a test command. After the value of the internal refresh counter is incremented, predetermined data is written on the incremented column address by another write command.

The write process is performed repeatedly thereafter. When the count value of the internal refresh counter reaches a final value, the executed command is changed from the write command to a read command and a data check is carried out. The command is shifted when re-entering the test mode after exiting the test mode.

Generally, when the SDRAM is in the test mode, a so-called write-read process, in which test data is immediately read after the test data is written, is also performed to test every cell.

A RAM which acquires commands in short cycles of 20 nanoseconds has also been proposed. The FCRAM is adapted to cope with high speeds by acquiring external commands (read/write command) and external addresses (row address and column address) in synchronism with clock signals. Such a RAM is referred to as a fast cycle (FC) RAM. The control signals of the FCRAM have cycles that are shorter than those of the SDRAM described above. Furthermore, the FCRAM differs from the conventional SDRAMs in that active commands are not used. The FCRAM is provided with an auto precharge function which automatically executes precharge after the read process or the write process to increase the speed.

The FCRAM operates at a higher speed than the SDRAM. Thus, when the technology applied to the SDRAM is applied to the DRAM, the following shortcomings occur.

(1) Due to the FCRAM's control signal cycle, which is shorter than the SDRAM's control signal cycle, the FCRAM cannot adjust the timing as accurately as the SDRAM if the timing is adjusted in the same manner as the SDRAM. More particularly, the FIB process carried out on the SDRAM is performed before a protective film, such as polyimide, is applied to the circuits of the device since the timing cannot be adjusted unless the wires are uncovered. However, the protective film greatly affects the wire capacitance and changes the delay times of the control signals. Thus, the formation of the protective film varies the timing even if the timing is adjusted through the FIB process. Accordingly, the timing cannot be adjusted with high accuracy regardless of whether the timing adjustment is carried out before the formation of the protective film. That is, the timing cannot be adjusted if the protective film is applied as in the actual state of usage.

(2) The FCRAM acquires the row addresses and column addresses simultaneously and activates the RAS and CAS circuits simultaneously. Therefore, when the FCRAM carries out the same counter test as the SDRAM, the refresh counter value is incremented whenever entering the test cycle in accordance with the test command. Furthermore, since the FCRAM acquires the row address and the column address simultaneously, the value of the refresh counter is incremented each time the write command is acquired. This writes test data on every other cell. Thus, every cell cannot be tested if the read/write operation is performed in the same manner as the SDRAM.

(3) The performance of a burn-in test on the FCRAM to effectively eliminate initial malfunctions also leads to a shortcoming. The burn-in test is carried out to detect initial malfunctions by actuating the device under conditions that are higher than the rated ambient temperature and the rated power supply voltage.

During the burn-in test, the device may be operated with an extremely long cycle of several hundreds of microseconds. In such case, the FCRAM automatically performs precharge after a read process or a write process regardless of the clock cycle. Thus, the FCRAM is in a precharge state during most of the test time. Accordingly, the FCRAM cannot be tested effectively.

Furthermore, the auto precharge is performed each time the refresh counter is operated when performing the counter test. Accordingly, the precharge operation is not necessary when testing only the refresh counter.

Accordingly, it is an objective of the present invention to provide a semiconductor memory device which performs tests efficiently and with high accuracy.

SUMMARY OF THE INVENTION

To achieve the above objective, the present invention provides a method for testing a semiconductor memory device that acquires an external command and an external address in synchronism with a clock signal. The device includes a signal wire through which a control signal is provided and a plurality of capacitors connected in parallel to the signal wire via a plurality of switch circuits. The method includes the steps of connecting a predetermined number of the capacitors to the signal wire by making a predetermined number of the switch circuits conductive, providing the control signal to the signal wire, measuring the transmission time of the control signal, and varying the capacitance of the signal wire by altering the number of the conductive switch circuits.

In a second aspect of the present invention, a semiconductor memory device that acquires an external command and an external address simultaneously in synchronism with a clock signal is provided. The device includes a signal wire through which a control signal is provided, a plurality of capacitors connected in parallel to the signal wire via a plurality of switch circuits, a test mode setting circuit for generating a mode signal provided to the signal wire in accordance with the external command, and a selecting circuit connected to the test mode setting circuit and each of the switch circuits for generating a selection signal, which selects the switch circuit that is made conductive, and provides the selection signal to the selected switch circuit when receiving the mode signal from the test mode setting circuit.

In a third aspect of the present invention, a method for testing a semiconductor memory device that acquires an external command and an external address in synchronism with a clock signal is provided. The device includes a refresh counter for generating an internal address, and an address latch circuit for latching either the external address or the internal address. The method includes the steps of providing a mode signal which instructs the device to execute operations and providing a pulse signal derived from the external command. The operations include a counter testing operation and a refresh operation. The method also includes the steps of incrementing the value of the internal address in accordance with the pulse signal when the mode signal instructs execution of the counter testing operation or the refresh operation, and latching the internal address in the address latch circuit.

In a fourth aspect of the present invention, a semiconductor memory device that acquires an external command, which includes a write command and a read command, and an external address in synchronism with a clock signal is provided. The device includes a mode setting circuit for receiving a pulse signal and generating control pulse signals. The pulse signal is generated in accordance with the write command and the read command. The mode setting circuit generates a first control pulse signal in accordance with a first mode signal which instructs execution of a counter testing operation and a refresh operation based on the external command. The mode setting circuit further generates a second control pulse signal in accordance with a second mode signal which instructs execution of an operation other than the counter testing operation and the refresh operation. A refresh counter is connected to the mode setting circuit. The refresh counter receives the first control pulse signal from the mode setting circuit and performs a counting operation in accordance with the first control pulse signal. An address latch circuit is connected to the mode setting circuit and the refresh counter. The address latch circuit outputs either the first control pulse signal or the second control pulse signal as a row address. The address latch circuit latches the count value of the refresh counter in accordance with the first control pulse signal and outputs the latched value as the row address. The address latch circuit also latches the external address acquired together with the write command or the read command in accordance with the second control pulse signal and outputs the latched value as the row address.

In a fifth aspect of the present invention, a method for testing a semiconductor memory device that acquires an external command, which includes a write command and a read command, and an external address in synchronism with a clock signal and automatically performs precharge after the read operation or the write operation is provided. The method includes the steps of setting a test mode, and stopping the precharge when either the read operation or the write operation is performed.

In a sixth aspect of the present invention, a semiconductor memory device that acquires an external command, which includes a write command and a read command, and an external address simultaneously in synchronism with a clock signal and automatically performs precharge after the read operation or the write operation is provided. The device includes a read/write control circuit for generating an auto precharge signal for a predetermined time after the read operation and write operation are performed. A precharge control circuit receives the auto precharge signal and outputs a precharge signal. A test mode setting circuit provides a mode signal, which invalidates the auto precharge signal to the precharge control signal.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS (First Embodiment)

An FCRAM according to a first embodiment of the present invention will now be described with reference to FIGS. 1 to 3.

Figure 1:
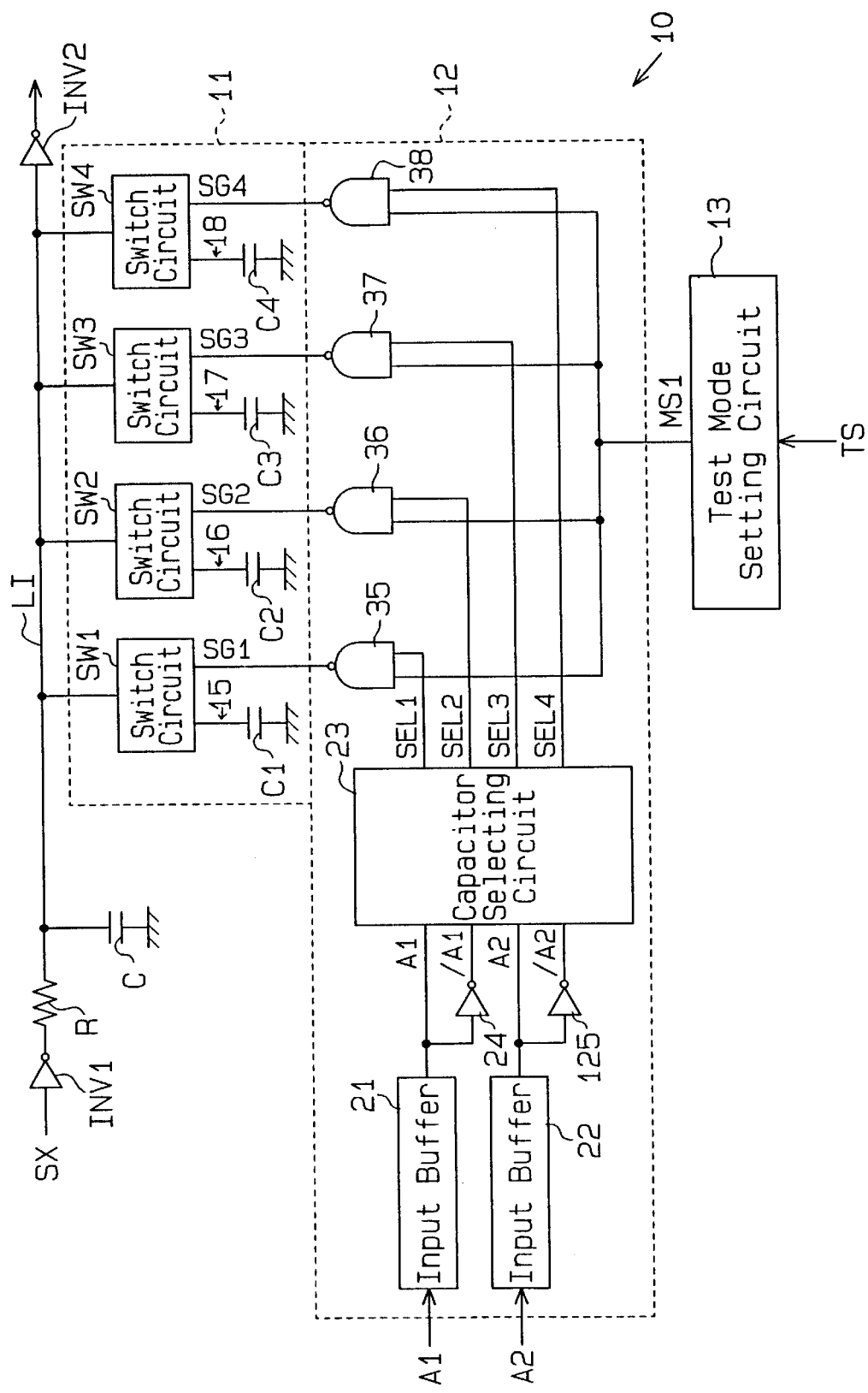
FIG. 1 is a schematic diagram showing a timing adjustment circuit of a synchronous DRAM according to a first embodiment of the present invention.

As shown in FIG. 1, the FCRAM includes a timing adjustment circuit 10 connected to a signal wire LI . The timing adjustment circuit 10 may also be connected to a signal wire through which control signals, such as a bit wire control signal, a word line latch signal, and a sense amplifier signal, are transmitted. First and second inverters INV1, INV2, a resistor R, and a capacitor C are connected to the signal wire LI. The timing adjustment circuit 10 is connected to the signal wire LI between the first and second inverters INV1, INV2. The first inverter INV1 receives a control signal SX from an internal circuit (not shown) and provides the inverted control signal SX to the second inverter INV2 through the signal wire LI. The second inverter INV2 inverts the inverted control signal SX and then provides the control signal SX to the next internal circuit (not shown). The resistor R and the capacitor C form a delay circuit.

The timing adjustment circuit 10 includes a delay time adjustment circuit 11, a selection circuit 12, and a test mode setting circuit 13.

The delay time adjustment circuit 11 includes first, second, third, and fourth delay circuits 15, 16, 17, 18. The delay circuits 15–18 include switch circuits SW18, SW2, SW3, SW4 and capacitors C1, C2, C3, C4, respectively.

Figure 2:
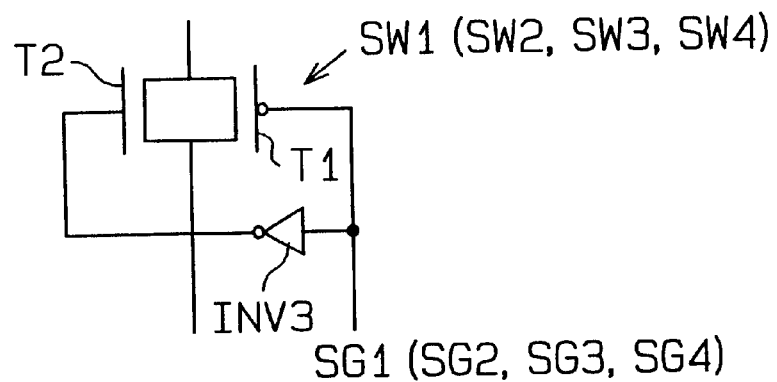
FIG. 2 is a circuit diagram showing a switch circuit of the timing adjustment circuit of FIG. 1.

As shown in FIG. 2, each of the switch circuits SW1–SW4 includes a p-channel MOS transistor T1, an n-channel MOS transistor T2, and an inverter INV3. The transistors T1, T2 form a transfer gate circuit.

The PMOS transistor T1 has a gate which receives an associated first, second, third, or fourth gate signal SG1, SG2, SG3, SG4. The NMOS transistor T2 has a gate which receives the same gate signal SG1, SG2, SG3, SG4 via the inverter INV3.

When the first to fourth gate signals SG1–SG4 are low, the associated switch circuits SW1–SW4 are activated. This connects the associated switch circuit SW1–SW4 to the signal wire LI. If the first to fourth gate signals SG1–SG4 are high, the associated switch circuit SW1–SW4 is de-activated. This electrically disconnects the associated switch circuit SW1–SW4 from the signal wire LI.

Accordingly, the number of capacitors C1–C4 connected to the signal wire LI is controlled by controlling the level of the first to fourth gate signals SG1–SG4. This adjusts the wire capacitance of the signal wire LI and the transmission timing of the control signal SX. The transmission delay increases as the number of the capacitors C1–C4 connected to the signal wire LI increases. Of course, as will be understood by those of ordinary skill in the art, the transmission delay can also be effected by various size capacitors.

As shown in FIG. 1, the selection circuit 12 includes a first input buffer 21, a second input buffer 22, a capacitor selecting circuit 23, a first gate circuit 35, a second gate circuit 36, a third gate circuit 37, and a fourth gate circuit 38. The first and second input buffers 21, 22 receive first and second designation signals A1, A2, respectively, and provide the designation signals A1, A2 to the capacitor selecting circuit 23. The first designation signal A1 from the first input buffer 21 is provided directly to the capacitor selecting circuit 23. The designation signal A1 is also provided to the capacitor selecting circuit 23 via an inverter 24 as a third designation signal /A1. The first and third designation signals A1, /A1 are complementary signals. The second designation signal A2 from the second input buffer 22 is provided directly to the capacitor selecting circuit 23. The designation signal A2 is also provided to the capacitor selecting circuit 23 via an inverter 125 as a fourth designation signal /A2. The second and fourth designation signals A2, /A2 are complementary signals. The first to fourth designation signals A1, A2, /A1, /A2 are used to select the capacitors C1–C4 to be connected to the signal line LI.

Figure 3:
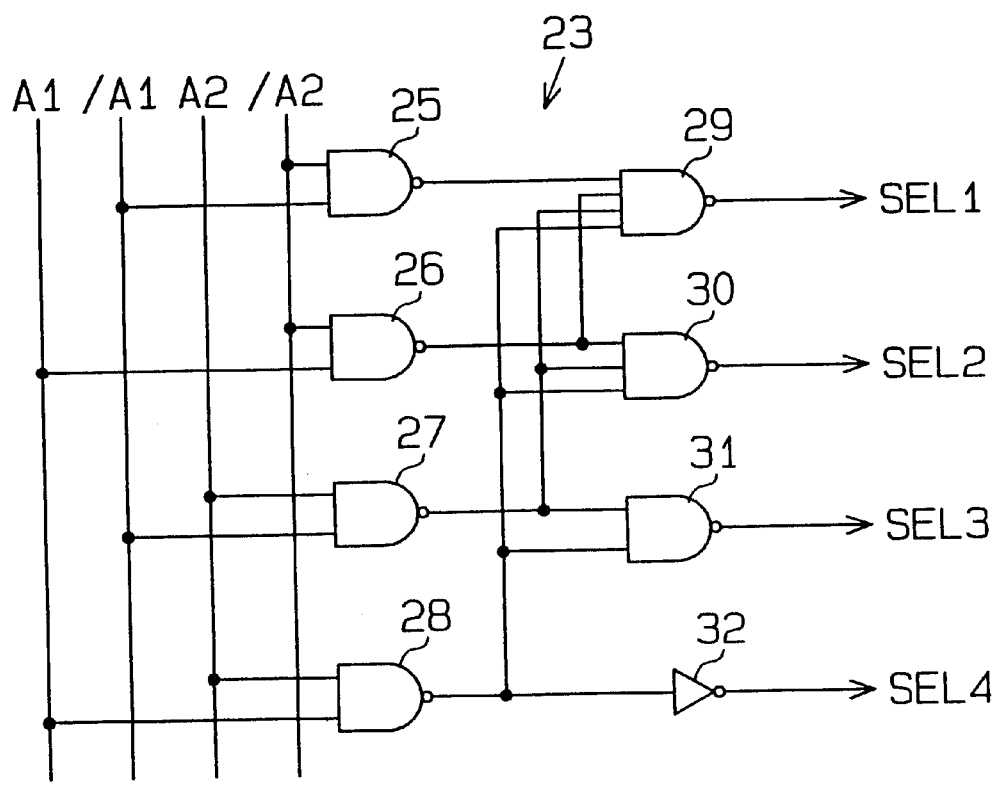
FIG. 3 is a schematic diagram showing a capacitor selecting circuit of the timing adjustment circuit of FIG. 1.

As shown in FIG. 3, the capacitor selecting circuit 23 has first to seventh NAND circuits 25–31 and an inverter 32.

The first NAND circuit 25 has two input terminals which receive the third and fourth designation signals /A1,/A2 and an output terminal connected to the input terminal of the fifth NAND circuit 29. The second NAND circuit 26 has two input terminals which receive the first and fourth designation signals A1,/A2 and an output terminal connected to the input terminals of the fifth and sixth NAND circuits 29, 30. The third NAND circuit 27 has two input terminals which receive the third and second designation signals /A1, A2 and an output terminal connected to the input terminals of the fifth to seventh NAND circuits 29–31. The fourth NAND circuit 28 has two input terminals which receive the first and second designation signals A1, A2 and an output terminal connected to the input terminals of the fifth to seventh NAND circuits 29–31 and to the inverter 32.

The fifth NAND circuit 29 receives the signals from the first to fourth NAND circuits 25–28 and provides a first selection signal SEL1 to the first gate circuit 35. The sixth NAND circuit 30 receives the signals from the second to fourth NAND circuits 26–28 and provides a second selection signal SEL2 to the second gate circuit 36. The seventh NAND circuit 31 receives the signals from the third and fourth NAND circuits 27, 28 and provides a third selection signal SEL3 to the third gate circuit 37. The inverter 32 receives the signal from the fourth NAND circuit 28 and provides a fourth selection signal SEL4 to the fourth gate circuit 38.

The level of each of the first to fourth selection signals SEL1–SEL4 is set in accordance with the levels of the first and second designation signals A1, A2. If the first and second designation signals A1, A2 are both low, the first selection signal SEL1 is high and the second to fourth selection signals SEL2–SEL4 are all low. If the first designation signal A1 is high and the second designation signal A2 is low, the first and second selection signals SEL1, SEL2 are high and the third and fourth selection signals SEL3, SEL4 are low. If the first designation signal A1 is low and the second designation signal A2 is high, the first to third selection signals SEL1–SEL3 are high and the fourth selection signal SEL4 is low. If the first and second designation signals A1, A2 are both high, the first to fourth selection signals SEL1–SEL4 are all high.

As shown in FIG. 1, the first to fourth gate circuits 35–38 receive the associated first to fourth selection signals SEL1–SEL4 from the capacitor selecting circuit 23 and a mode signal MS1 from the test mode setting circuit 13. The first to fourth gate circuits 35–38 provide the associated delay circuits 15–18 with the corresponding first to fourth gate signals SG1–SG4.

Therefore, when the mode signal MS1 is high, the first to fourth gate circuits 35–38 provide the first to fourth gate signals SG1–SG4 to the associated switch circuits SW1–SW4.

If the first and second designation signals A1, A2 are both low, the first gate signal SG1 falls, which activates the switch circuit SW1. This connects the capacitor C1 to the signal wire LI. If the first designation signal A1 is high but the second designation signal A2 is low, the first and second signals SG1, SG2 fall, which activates the switch circuits SW1, SW2. This connects the capacitors C1, C2 to the signal wire LI. If the first designation signal A1 is low but the second designation signal A2 is high, the first to third gate signals SG1–SG3 fall, which activates the switch circuits SW1–SW3. This connects the capacitors C1–C3 to the signal wire LI. If the first and second designation signals A1, A2 are both high, the first to fourth gate signals SG1–SG4 fall, which activates the switch circuits SW1–SW4. This connects the capacitors C1–C4 to the signal wire LI.

The test mode setting circuit 13 receives a test signal TS generated in accordance with a test command, which is sent from a testing apparatus (not shown), and provides the mode signal MS1 to the first to fourth gate circuits 35–38. When the level of the test signal TS indicates execution of the test mode (e.g., when the signal TS is high), the test mode setting circuit 13 provides a high mode signal MS1 to the first to fourth gate circuits 35–38. In this state, the capacitor C1–C4 connected to the signal wire LI is selected in accordance with the combination of the levels of the first and second designation signals A1, A2. If the level of the test signal TS indicates that the test mode is not being executed (e.g., when the signal TS is low), the test mode setting circuit 13 provides a low mode signal MS1 to the first to fourth gate circuits 35–38. In this state, the first to fourth gate signals SG1–SG4 all rise, which causes all of the capacitors C1–C4 to be electrically disconnected from the signal wire LI regardless of the level of the first and second designation signals A1, A2.

The operation of the timing adjustment circuit 10 will now be described.

The test mode setting circuit 13 is provided with a high test signal TS in order to test the transmission timing of the control signal SX, which is transmitted between the first and second inverters INV1, INV2, with the testing apparatus. A high mode signal MS1 is then provided to the first to fourth gate circuits 35–38.

If the first and second designation signals A1, A2 both fall in response to the command from the testing apparatus, the capacitor C1 is connected to the signal wire LI. This provides a testing control signal SX to the signal wire LI. In this state, the transmission time (i.e., transmission timing) required for the control signal SX to reach the second inverter INV2 from the first inverter INV1 is measured.

After the time measurement, a high first designation signal A1 and a low second designation signal A2 connect the capacitors C1, C2 to the signal wire LI. In this state, the transmission time required for the control signal SX to reach the second inverter INV2 from the first inverter INV1 is measured.

A low first designation signal A1 and a high second designation signal A2 then connect the capacitors C1–C3 to the signal wire LI. In this state, the transmission time required for the control signal SX to reach the second inverter INV2 from the first inverter INV1 is measured.

Finally, high first and second designation signals A1, A2 are provided to connect the capacitors C1–C4 to the signal wire LI. In this state, the transmission time required for the control signal SX to reach the second inverter INV2 from the first inverter INV1 is measured. This completes the testing of the transmission time.

As described above, the number of capacitors C1–C4 connected to the signal wire LI is altered in accordance with the combination of the level of the first and second designation signals A1, A2. This facilitates transmission time measurement, which is necessary to obtain the optimal timing of the control signal SX.

The testing method of the first embodiment differs from the prior art testing method, which uses an EB tester, in that the testing may be executed after the FIB process has been carried out on the circuits of the device. Accordingly, the testing method of the first embodiment is performed efficiently and with high accuracy since the test is carried out with the protective film (e.g., polyimide) already applied to the circuit wires, which is the actual state of usage.

The test is carried out by activating the switch circuits SW1–SW4 when the first to fourth delay circuits 15–18 (capacitors C1–C4) are disconnected from the signal wire LI. However, the test may also be carried out by activating the switch circuits SW1–SW4 when the first to fourth delay circuits 15–18 (capacitors C1–C4) are connected to the signal wire LI.

(Second Embodiment)

An FCRAM according to a second embodiment of the present invention will now be described with reference to FIGS. 4 to 6.

Figure 4:
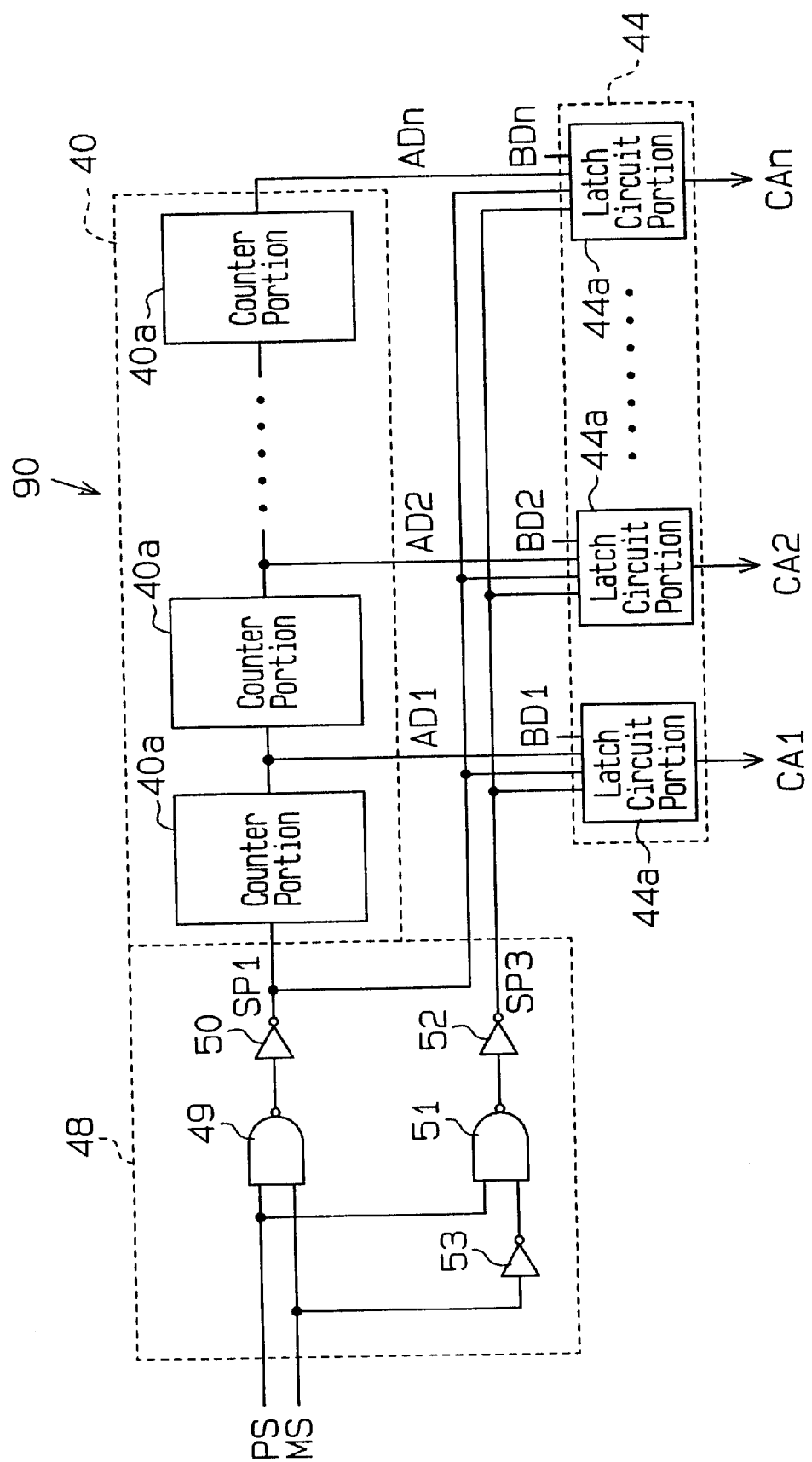
FIG. 4 is a schematic diagram showing a counter tester circuit of a refresh counter according to a second embodiment of the present invention.

As shown in FIG. 4, the FCRAM includes a counter test circuit 90. The counter test circuit 90 is provided with a refresh counter 40, an address latch circuit 44, and a mode setting circuit 48.

The refresh counter 40 is an n base counter including a plural number (n) of counter portions 40a, which are connected to one another in series. The counter portions 40a output signals AD1–ADn, which are used to form an address value. Thus, the address value increases by one each time the first (initial stage) counter portion 40a receives a pulse signal.

Figure 5:
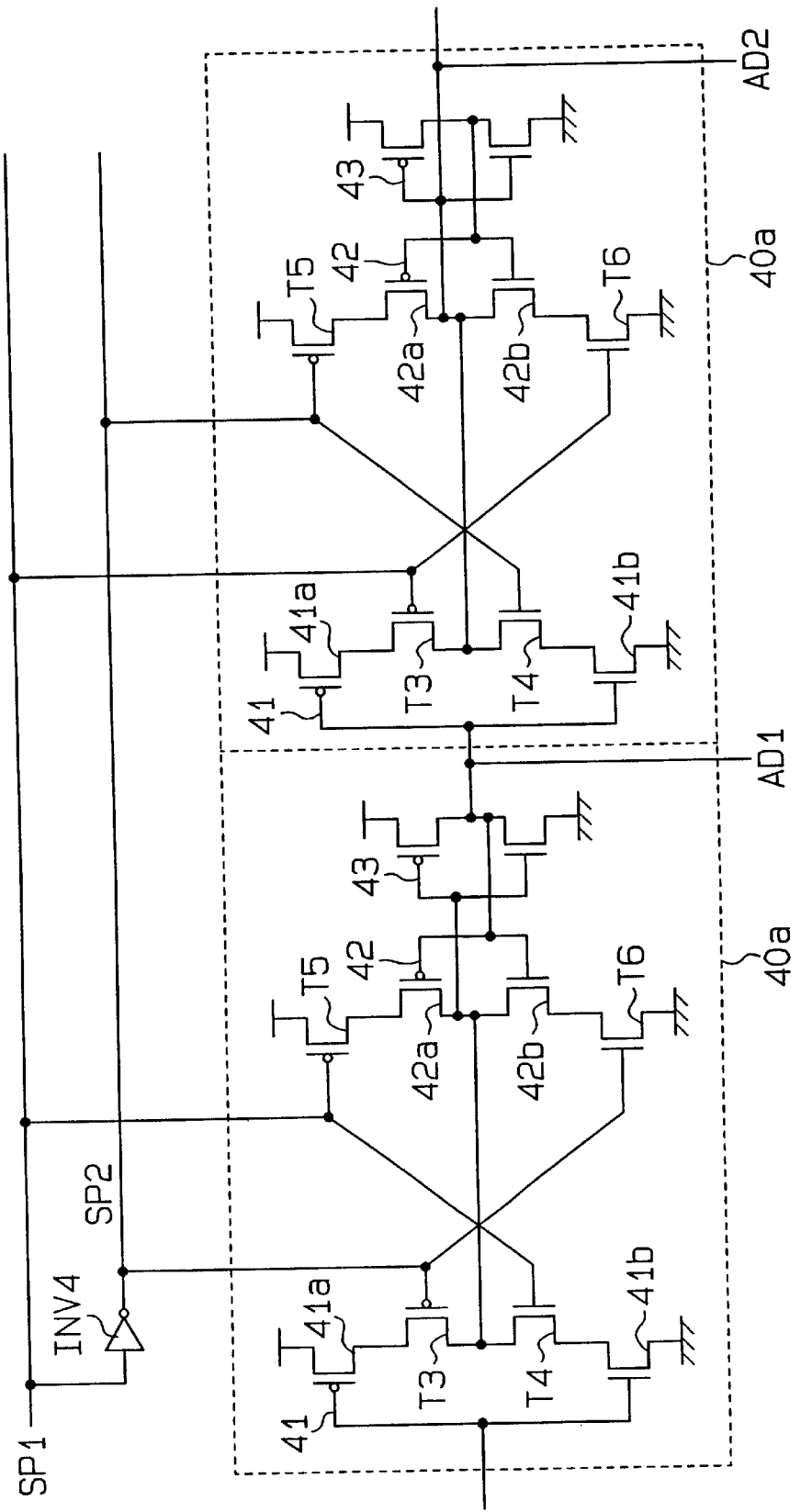
FIG. 5 is a circuit diagram showing a counter portion of the counter test circuit of FIG. 4.
Figure 6:
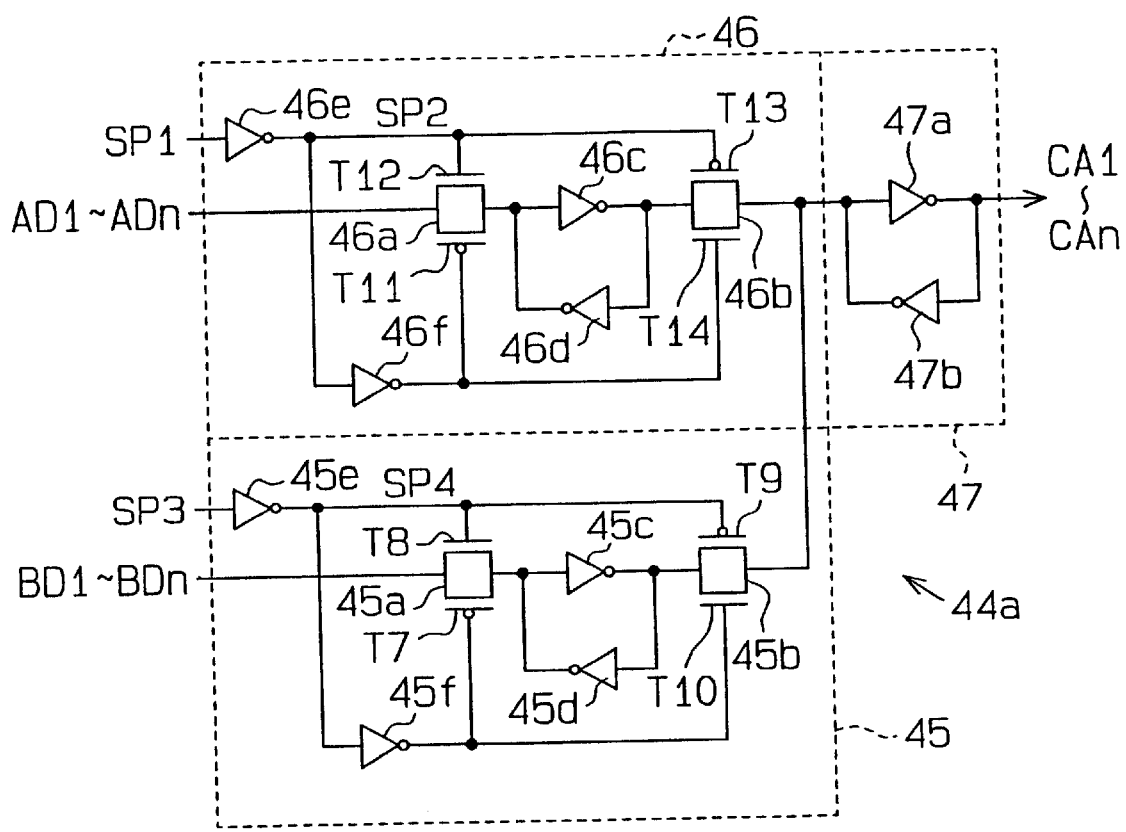
FIG. 6 is a circuit diagram showing a latch circuit portion of the counter test circuit of FIG. 4.

The first and second counter portions 40a are shown in FIG. 5. Each of the counter portions 40a directly receives a first control pulse signal SP1 and a second control pulse signal SP2, which is obtained by inverting the first control pulse signal SP1 with an inverter INV4. The first and second control pulse signals SP1, SP2 are complementary signals.

The first counter portions 40a each include first, second, and third CMOS inverter circuits 41, 42, 43. The first CMOS inverter 41 has a PMOS transistor 41a and an NMOS transistor 41b. A PMOS transistor T3 and an NMOS transistor T4 are connected between the PMOS and NMOS transistors 41a, 41b. The PMOS transistor T3 is activated and deactivated with the second control pulse signal SP2. The NMOS transistor T4 is activated and deactivated with the first control pulse signal SP1. The first CMOS inverter circuit 41 is activated when the first control pulse signal SP1 is high and deactivated when the first control pulse signal SP1 is low. Further, the first CMOS inverter circuit 41 has an input terminal connected to the mode setting circuit 48 and an output terminal connected to the output terminal of the second CMOS inverter 42 and the input terminal of the third CMOS inverter circuit 43.

The second CMOS inverter 42 has an input terminal connected to the output terminal of the third CMOS inverter 43. Thus, the second and third CMOS inverters 42, 43 form a latch circuit. The third CMOS inverter circuit 43 outputs a signal AD1.

The second CMOS inverter 42 has a PMOS transistor 42a and an NMOS transistor 42b. A PMOS transistor T5, activated and deactivated with the first control pulse signal SP1, is connected to the PMOS transistor 42a. An NMOS transistor T6, activated and deactivated with the second control pulse signal SP2, is connected to the NMOS transistor 42b. The second CMOS inverter circuit 42 is activated when the first control pulse signal SP1 is low and deactivated when the first control pulse signal SP1 is high.

Therefore, when the first CMOS inverter circuit 41 is activated, the second CMOS inverter circuit 42 is deactivated, and when the first CMOS inverter circuit 41 is deactivated, the second CMOS inverter circuit 42 is activated.

The second counter portion 40a has the same structure as the first counter portion 40a, but differs in that the first control pulse signal SP1 is provided to the PMOS and NMOS transistors T3, T6 and the second control pulse signal SP2 is provided to the PMOS and NMOS transistors T4, T5. Further, the second counter portion 40a receives the signal AD1 from the first counter portion 40a and outputs a signal AD2. Odd order counter portions 40a have substantially the same structure as the first counter portion 40a and even order counter portions 40a have substantially the same structure as the second counter portion 40a.

Accordingly, the first and second counter portions 40a have a relationship as described below.

When the first CMOS inverter circuit 41 of the first counter 40a is activated and the signal from the mode setting circuit 48 is being acquired, the first CMOS inverter circuit 41 of the second counter portion 40a is deactivated. Thus, the counter portion 40a of the second counter portion 40a does not acquire the signal acquired by the first counter portion 40a. In this state, the second counter 40a provides the signal previously latched by the second and third CMOS inverter circuits 42, 43 to the third counter portion 40a (not shown).

The first CMOS inverter circuit 41 of the first counter portion 40a is then deactivated and the first CMOS inverter circuit 41 of the second counter portion 40a is activated. This causes the second counter portion 40a to acquire the signal latched by the first counter portion 40a. In this state, the signal latched by the second counter portion 40a is not acquired by the third counter portion 40a since the first CMOS inverter circuit 41 of the third counter portion (not shown) is deactivated.

In this manner, the refresh counter 40 increases the address value, formed by the signals AD1–ADn, by one each time the refresh counter 40 receives the first control pulse signal SP1.

With reference to FIG. 4, the address latch circuit 44 receives the signals AD1–ADn from the counter portions 40a. The address latch circuit 44 further receives external address signals BD1–BDn and selects either the signals AD1–ADn or the external address signal BD1–BDn to output row address signals CA1–CAn.

The address latch circuit 44 includes latch circuit portions 44a, the number of which is the same as the number of the counter portions 40a of the refresh counter 40. As shown in FIG. 6, each of the latch circuit portions 44a includes a first latch portion 45 which latches the external address signal BD1–BDn, a second latch portion 46 which latches the signals AD1–ADn, and a third latch portion 47 which latches the signal from the first and second latch portions 45, 46 and outputs the latched signal as the corresponding row address signal CA1–CAn.

The first latch portion 45 includes two transfer gate circuits 45a, 45b and four inverters 45c, 45d, 45e, 45f. The inverters 45c, 45d form a latch circuit. The input terminal of the latch circuit is connected to the transfer gate circuit 45a. The output terminal of the latch circuit is connected to the transfer gate circuit 45b.

The transfer gate circuit 45a includes a PMOS transistor T7 and an NMOS transistor T8. The PMOS transistor T7 has a gate which receives a control pulse signal via the inverters 45e, 45f. Since the phase of the control pulse signal is the same as that of a third control pulse signal SP3, the control pulse signal will be referred to as the third control pulse signal SP3. The NMOS transistor T8 has a gate which receives a fourth control pulse signal SP4 via the inverter 45e. The third and fourth control pulse signals SP3, SP4 are complementary signals.

The transfer gate circuit 45b includes a PMOS transistor T9 and an NMOS transistor T10. The PMOS transistor T9 has a gate which receives the fourth control pulse signal SP4 via the inverter 45e. The NMOS transistor T10 has a gate which receives the third control pulse signal SP3 via the inverters 45e, 45f.

When the third control pulse signal SP3 is low, the transfer gate circuit 45a is activated and the transfer gate circuit 45b is deactivated. If the third control pulse signal SP3 is high, the transfer gate circuit 45a is deactivated and the transfer gate circuit 45b is activated.

If the third control pulse signal SP3 falls, the latch portion 45 of each latch circuit portion 44a receives the corresponding external address signal BD1–BDn and latches the external address signal BD1–BDn with the latch circuit formed by the inverters 45c, 45d. When the third control pulse signal SP3 rises, each latch portion 45 provides the latched corresponding external address signal BD1–BDn to the third latch portion 47.

The structure and operation of the second latch circuit 46 is substantially the same as the first latch circuit 45. The second latch circuit 46 includes elements 46a–46f which correspond to the elements 45a–45f of the first latch portion 45, respectively. The inverter 46e receives the first control pulse signal SP1 and provides the second control pulse signal SP2 to the transfer gate circuits 46a, 46b.

When the first control pulse signal SP1 falls, the latch portion 46 of each latch circuit portion 44a receives the corresponding output signal AD1–ADn and latches the output signal AD1–ADn with the latch circuit formed by the inverters 46c, 46d. When the first control pulse signal SP1 rises, the latched signal AD1–ADn is provided to the third latch portion 47.

The third latch portion 47 includes two inverters 47a, 47b which form a latch circuit. If the third latch portion 47 receives the corresponding external address signal BD1–BDn from the first latch portion 45, the third latch portion 47 outputs the external address signal BD1–BDn as the corresponding row address signal CA1–CAn. Further, if the third latch portion 45 receives the signal AD1–ADn from the second latch portion 46, the third latch portion 47 outputs the signal AD1–ADn as the corresponding row address signal CA1–CAn.

The mode setting circuit 48, which controls the selection operation of the address latch circuit 44, will now be described with reference to FIG. 4. The mode setting circuit 48 includes a first NAND circuit 49 and a second NAND circuit 51. The signal from the first NAND circuit 49 is provided to the refresh counter 40 and the address latch circuit 44 via an inverter 50 as the first control pulse signal SP1.

The first NAND circuit 49 has two input terminals, an address control input terminal and a counter test control input terminal. The address control input terminal is provided with a pulse signal PS, which is generated when the DRAM receives a write command or a read command. The counter test control input terminal is provided with a mode signal MS. The mode signal MS is low in a normal operation mode and high when the counter test operation or refresh operation is being performed.

If the mode signal MS is low (normal operation), the first control pulse signal SP1 remains low regardless of the level of the pulse signal PS. If the mode signal MS is high (counter test operation or refresh operation), the first control pulse signal SP1 having the same phase as the pulse signal PS is generated each time the pulse signal PS is provided.

The second NAND circuit 51 has an input terminal which receives the pulse signal PS and another input terminal which receives the mode signal MS via an inverter 53. The signal output by the second NAND circuit 51 is provided to the address latch circuit 44 as the third control pulse signal SP3 via an inverter 52.

If the mode signal MS is low (normal operation), the third control pulse signal SP3 having the same phase as the pulse signal PS is generated each time the pulse signal PS is provided. If the mode signal MS is high (counter test operation or refresh operation), the third control pulse signal SP3 remains low regardless of the level of the pulse signal PS.

The operation of the counter test circuit 90 will now be described.

When performing the counter test of the refresh counter 40 using a testing apparatus, a high mode signal MS is provided to the mode setting circuit 48 by the testing apparatus.

The mode setting circuit 48 receives a pulse signal PS at the counter test control input terminal in response to a write command from the testing apparatus. This causes the inverter 50 to provide the first control pulse signal SP1, which phase is the same as the pulse signal PS, to the refresh counter 40. The third control pulse signal SP3 output by the inverter 52 remains low regardless of the level of the pulse signal PS.

The counter portions 40a of the refresh counter 40 increase the signals AD1–ADn, or the address value, by one in response to the first control pulse signal SP1. Since the third control pulse signal SP3 remains low and the transfer gate circuit 45b is deactivated, the first latch portions 45 of the address latch circuit 44 do not provide the third latch portions 47 with the corresponding external address signals BD1–BDn even when receiving the external address signals BD1–BDn.

The second latch portions 46 of the address latch circuit 44 latches the counted signals AD1–ADn (i.e., address value) in response to the first control pulse signal SP1. Further, the second latch portions 46 provide the associated third latch portions 47 with the corresponding latched signal AD1–ADn and do not acquire the signals AD1–ADn until the next first control signal SP1 is generated.

Subsequently, if the mode setting circuit 48 receives the pulse signal PS at the counter test input terminal in response to a new write command, the counter portions 40a increase the corresponding signals AD1–ADn (i.e., address value) by one in response to the first control pulse signal SP1. Further, the second latch portions 46 latch the counted signals AD1–ADn in response to the first control pulse signal SP1 and provide the signals AD1–ADn to the associated third latch portions 47.

In the same manner, the counter portions 40a continues to increase the signals AD1–ADn (address value) by one in response to new write commands and output the signals AD1–ADn via the associated second and third latch portions 46, 47 as the row addresses CA1–CAn.

When the signals AD1–ADn (address value) from the refresh counter 40 reach the final value (i.e., when test data is written on the cells corresponding to all of the addresses), a read command is provided to the FCRAM from the testing apparatus. In other words, the test data written on every cell in accordance with the preceding write commands is inspected.

If the mode setting circuit 48 is provided with a pulse signal PS at the counter test control input terminal in response to the read command, the inverter 50 provides the first control pulse signal SP1 to the refresh counter 40. In this state, the control portions 40a return to the initial address value (signals AD1–ADn), or the value when the count operation began in response to the first write command. The initial signals AD1–ADn are latched by the second latch portions 46 of the address latch circuit 44 and provided to the third latch portions 47. In other words, the row address of the cell on which data was written by the first write command is designated and the data of that cell is read.

In the same manner, the counter portions 40a continue to increase the signals AD1–ADn (address value) one at a time in response to new read commands and output the signals AD1–ADn as the row address signals CA1–CAn via the second and third latch portions 46, 47.

When the signals AD1–ADn from the refresh counter 40 reach the final value (i.e., when the test data written on the cells corresponding to all of the addresses is read), the testing apparatus completes the counter test.

The FCRAM, which acquires the row address and the column address simultaneously with the read/write command, performs the counter test in the same manner as the conventional SDRAM.

The address value is counted accurately by the write command which writes the test data and the read command which reads the test data. Thus, the counter test performed on the FCRAM is efficient and accurate.

In addition, when the writing of the test data on every cell is completed (i.e., when the refresh counter 40 completes one cycle), a read command immediately starts the read process. Consequently, the counter test is performed more efficiently than in the prior art.

The refresh operation is performed in the same manner as the read operation and the write operation except that the high mode signal MS and the pulse signal PS are not generated by the testing apparatus.

Normal operation of the FCRAM will now be described. A normal external command from an FCRAM controller, which serves as an external device, causes a low mode signal MS to be provided to the first and second NAND circuits 49, 51 of the mode setting circuit 48.

A write command from the FCRAM controller causes the pulse signal PS to be provided to the mode setting circuit 48 at the counter test control input terminal. This results in the output of the third control pulse signal SP3, which phase is the same as the pulse signal PS, by the inverter 52. The first control pulse signal SP1 from the inverter 50 remains low regardless of the level of the pulse signal PS.

Since the first control pulse signal SP1 remains low, the counter portions 40a do not perform the count operation. Furthermore, since the first control pulse signal SP1 remains low, the second latch portions 46 of the address latch circuit 44 do not latch the signals AD1–ADn (address value) from the counter portions 40a of the refresh counter 40 and provide the signals AD1–ADn to the third latch portions 47.

The first latch portions 45 of the address latch circuit 44 latch the external address signals BD1–BDn based on the address data acquired together with the write command in response to the third control pulse signal SP3. The first latch portions 45 provide the latched external address signals BD1–BDn to the third latch portions 47. The third latch portions 47 output the external address signals BD1–BDn as the row address signals CA1–CAn.

(Third Embodiment)

An FCRAM 200 according to a third embodiment of the present invention will now be described with reference to FIG. 7. The FCRAM of the third embodiment is provided with an auto precharge function.

Figure 7:
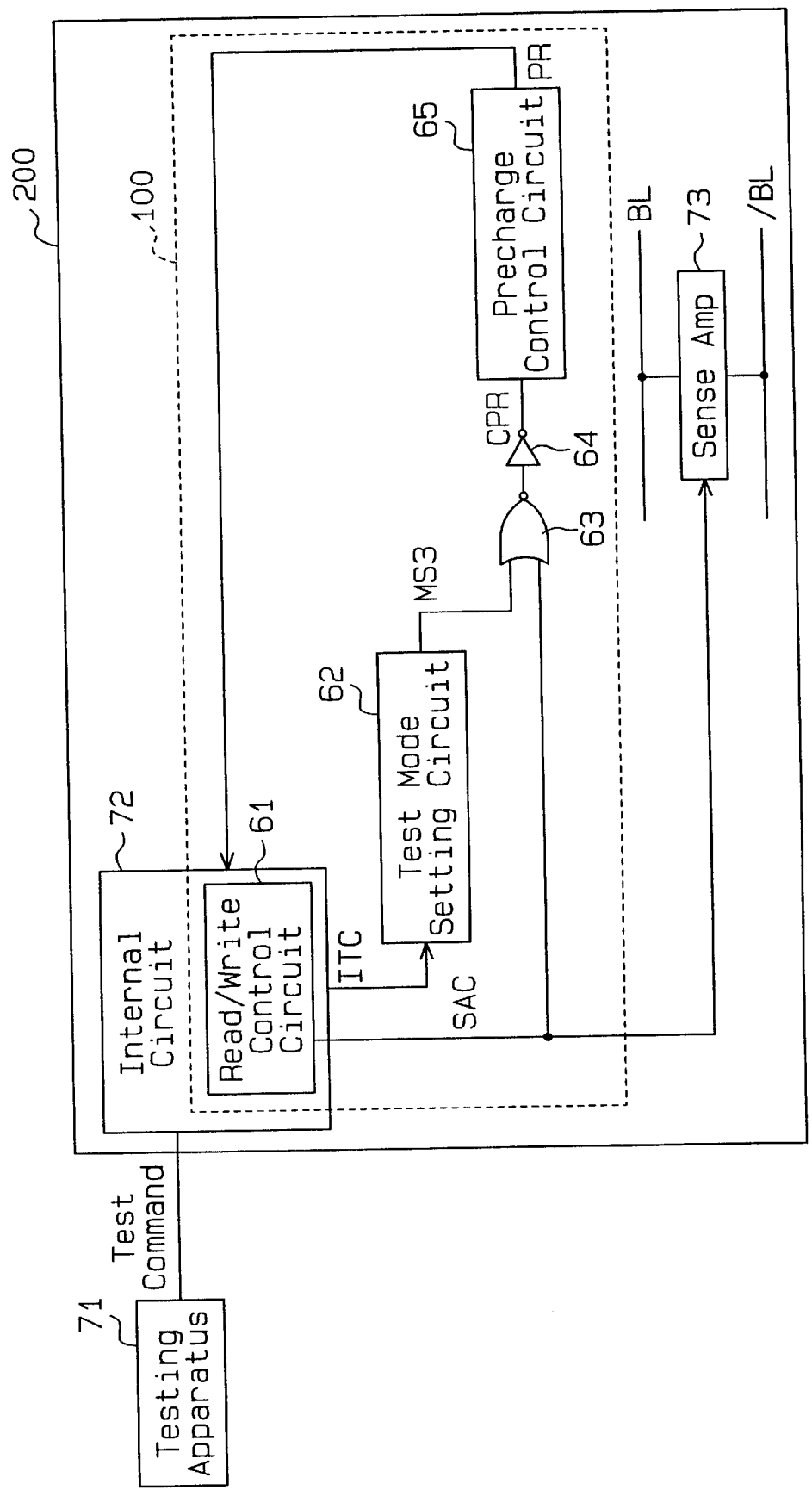
FIG. 7 is a schematic diagram showing an auto precharge stopping circuit according to a third embodiment of the present invention.

As shown in FIG. 7, the FCRAM 200 includes an auto precharge stopping circuit 100, an internal circuit 72, and a sense amplifier 73 connected between a bit line BL and a bit line /BL. The FCRAM 200 is connected to a burn-in testing apparatus 71.

The internal circuit 72 is provided with a read/write control circuit 61 which controls the sense amplifier 73. The internal circuit 72 receives a test command from the testing apparatus 71 and provides internal test command signals and a sense amplifier control signal SAC to the auto precharge stopping circuit 100. The internal circuit 72 generates an internal test command signal when receiving a test command for stopping unnecessary auto precharge.

The auto precharge stopping circuit 100 includes a read/write control circuit 61 arranged in the internal circuit 72, a test mode setting circuit 62, a NOR circuit 63 connected to the test mode setting circuit 62 and the read/write control circuit 61, an inverter 64 connected to the NOR circuit 63, and a precharge control circuit 65.

The read/write control circuit 61 generates a high sense amplifier control signal SAC when operating the sense amplifier 73 and a low sense amplifier signal SAC when terminating the operation of the sense amplifier 73. The read/write control circuit 61 provides the low sense amplifier control signal SAC to the NOR circuit 63 for a predetermined time. More specifically, the read/write control circuit 61 generates a low sense amplifier control signal SAC for a predetermined period after the operation of the sense amplifier 73 is completed during a read or write operation. The read/write control circuit 61 receives a signal indicating that the sense amplifier has completed amplification (e.g., a column selection signal) and generates a low sense amplifier control signal SAC.

The test mode setting circuit 62 provides a mode signal MS3 to the NOR circuit 63. More specifically, the test mode setting circuit 62 receives the internal test command signal generated by the internal circuit 72 in accordance with the command provided from the testing apparatus 71 when the DRAM is being tested. Upon receipt of the internal test command signal, the test mode setting circuit 62 generates a high mode signal MS3. If the testing is not being performed with the testing apparatus 100, the test mode setting circuit 62 generates a low mode signal MS3, since the internal test command signal is not received.

The NOR circuit 63 receives the signal SAC from the read/write control circuit 61 and the signal MS3 from the test mode setting circuit 62 and provides a precharge control signal CPR to the precharge control circuit 65 via the inverter 64.

When the mode signal MS3 is low (i.e., when in a mode other than the test mode), the phase of the precharge control signal CPR is the same as that of the sense amplifier control signal SAC. Thus, if a low sense amplifier control signal SAC is provided to the NOR circuit 63 for a predetermined time, the precharge control signal CPR is also low for the predetermined time. If the mode signal MS3 is high (i.e., when in the test mode), the precharge control signal CPR remains high regardless of the level of the sense amplifier control signal SAC.

The precharge control circuit 65 provides a precharge signal PR to the internal circuit 72 in response to the precharge control signal CPR. The precharge control signal CPR is inverted to obtain the precharge signal PR. When the precharge signal PR is high (i.e., when the sense amplifier control signal SAC is low), the internal circuit 72 activates a precharge circuit (not shown) to precharge the bit lines BL, /BL.

Figure 8:
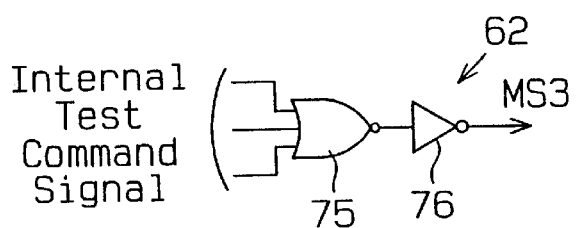
FIG. 8 is a schematic diagram showing a test mode setting circuit of the auto precharge stopping circuit of FIG. 7.

With reference to FIG. 8, the test mode setting circuit 62 includes a NOR circuit 75 and an inverter 76 which are connected in series to each other. The NOR circuit 75 has a plurality of input terminals which receive a plurality of internal command signals. When the NOR circuit 75 receives an internal command for stopping unnecessary precharge, the NOR circuit 75 provides a low signal to the inverter 76. The inverter 76 inverts the signal from the NOR circuit 75 and provides the inverted signal as the mode signal MS3 to the NOR circuit 63.

Figure 9:
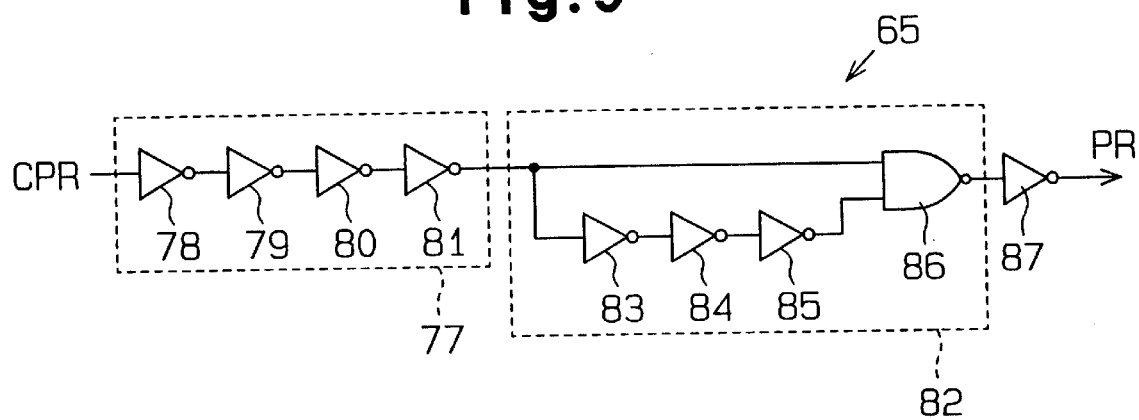
FIG. 9 is a schematic diagram showing a precharge control circuit of the auto precharge stopping circuit of FIG. 7.

As shown in FIG. 9, the precharge control circuit 65 includes a delay circuit 77, a high pulse generating circuit 82, and an inverter 87 which are connected to one another in series.

The delay circuit 77 includes four inverters 78, 79, 80, 81 which are connected to one another in series. The high pulse signal generating circuit 82 includes a NAND circuit 86 and three inverters 83, 84, 85. The NAND circuit 86 has an input terminal which receives a signal from the inverter 81 and a further input terminal which receives a signal from the inverter 81 via inverters 83–85. The NAND circuit 86 output is connected to the inverter 87, which then outputs the precharge signal PR.

The operation of the auto precharge stopping circuit will now be described.

The burn-in test performed on the FCRAM 200 will first be described. In order to initiate the burn-in test, the test mode setting circuit 62 provides a high mode signal MS3 to the NOR circuit 63 in accordance with an external command from the testing apparatus 71.

During the burn-in test, the FCRAM 200 performs the write operation and the read operation with a clock cycle of several hundred microseconds, which is longer than the normal clock cycle. The read/write control circuit 61 provides a low sense amplifier control signal SAC to the NOR circuit 63 over a predetermined time whenever the sense amplifier 73 is deactivated.

In this state, the NOR circuit 63 keeps the precharge control signal CPR high regardless of the low sense amplifier control signal SAC due to the high mode signal MS3 received from the test mode setting circuit 62. In other words, the test mode setting circuit 62 provides the high mode signal MS3 to the NOR circuit 63 to invalidate the sense amplifier control signal SAC.

Accordingly, in contrast to prior art FCRAMs, the FCRAM 200 is prevented from being maintained in a precharge state during most of the testing period, even though the clock cycle is extremely long. As a result, the burn-in test is performed efficiently and with high accuracy.

During a normal usage state (when not in the test mode), the test mode setting circuit 62 provides a low mode signal MS3 to the NOR circuit 63. The read/write control circuit 61 provides a low sense amplifier control signal SAC to the NOR circuit 63 for a predetermined time whenever operation of the sense amplifier 73 is completed. Thus, the precharge control circuit 65 provides a high precharge signal PR to the internal circuit 72 in response to the precharge control signal CPR, which phase is substantially the same as the sense amplifier control signal SAC. In other words, precharge is performed automatically whenever the read operation or the write operation is performed.

The precharge operation may be prohibited not only during the burn-in test but also when testing the refresh counter during the counter test. Furthermore, the auto precharge may be prohibited when tests that do not require auto precharge are performed.

The timing adjustment circuit 10 of the first embodiment, the counter test circuit 90 of the second embodiment, and the auto precharge stopping circuit 100 of the third embodiment may be combined in various ways in the FCRAM, as will be understood by those of skill in the art.

The present examples and embodiments are to be considered as illustrative and not restrictive, and the invention is not to be limited to the details given herein, but may be modified within the scope and equivalence of the appended claims.

What is claimed is:

1. A method for testing a semiconductor memory device that acquires an external command and an external address in synchronism with a clock signal, wherein the device includes a signal wire through which a control signal is provided and a plurality of capacitors connected in parallel to the signal wire via a plurality of switch circuits, wherein the method comprises the step of:

testing the transmission time of the control signal transmitted through the signal wire in accordance with the external command; wherein the testing step includes the steps of:

connecting a predetermined number of the capacitors to the signal wire by making a predetermined number of the switch circuits conductive;

providing the control signal to the signal wire;

measuring the transmission time of the control signal; and varying the capacitance of the signal wire by altering the number of the conductive switch circuits.

2. The method according to claim 1, further comprising the step of:

repeatedly performing the transmission time measuring step and the wire capacitance varying step.

3. The method according to claim 1, further comprising the step of:

determining the switch circuit that is made conductive.

4. A semiconductor memory device that acquires an external command and an external address simultaneously in synchronism with a clock signal, wherein the device comprises:

a signal wire through which a control signal is provided;

a plurality of capacitors connected in parallel to the signal wire via a plurality of switch circuits;

a test mode setting circuit for generating a mode signal provided to the signal wire in accordance with the external command; and a selecting circuit connected to the test mode setting circuit and each of the switch circuits for generating a selection signal, which selects the switch circuit that is made conductive, and provides the selection signal to the selected switch circuit when receiving the mode signal from the test mode setting circuit.

5. The device according to claim 4, wherein the value of the capacitors varies.

6. The device according to claim 5, wherein the selection circuit includes:

a capacitor selecting circuit for receiving a designation signal, which is based on the external command, and generating the selection signal in accordance with the designation signal; and a plurality of NAND circuits connected between the switch circuits and the capacitor selecting circuit, wherein each NAND circuit has an output terminal connected to the associated switch circuit and two input terminals which receive the selection signal and the mode signal.

7. A method for testing a semiconductor memory device that acquires an external command and an external address in synchronism with a clock signal, wherein the device includes a refresh counter for generating an internal address, and an address latch circuit for latching either the external address or the internal address, wherein the method comprises the step of:

testing the operation of the refresh counter; wherein the testing step includes the steps of:

providing a mode signal which instructs the device to execute operations, the operations including a counter testing operation and a refresh operation, and providing a pulse signal derived from the external command;

incrementing the value of the internal address in accordance with the pulse signal when the mode signal instructs execution of the counter testing operation or the refresh operation; and latching the internal address in the address latch circuit.

8. The method according to claim 7, further comprising the step of:

repeatedly performing the pulse signal providing step, the address value incrementing step, and the internal address latching step until the address value reaches a final value.

9. The method according to claim 7, further comprising the step of:

maintaining the value of the internal address generated by the refresh counter when the mode signal instructs execution of a normal operation, and latching the external address in the address latch circuit.

10. A semiconductor memory device that acquires an external command, which includes a write command and a read command, and an external address in synchronism with a clock signal, comprising:

a mode setting circuit for receiving a pulse signal and generating control pulse signals, wherein the pulse signal is generated in accordance with the write command and the read command, and wherein the mode setting circuit generates a first control pulse signal in accordance with a first mode signal which instructs execution of a counter testing operation and a refresh operation based on the external command, the mode setting circuit further generating a second control pulse signal in accordance with a second mode signal which instructs execution of an operation other than the counter testing operation and the refresh operation;

a refresh counter connected to the mode setting circuit, wherein the refresh counter receives the first control pulse signal from the mode setting circuit and performs a counting operation in accordance with the first control pulse signal; and an address latch circuit connected to the mode setting circuit and the refresh counter, wherein the address latch circuit outputs either the first control pulse signal or the second control pulse signal as a row address, the address latch circuit latching the count value of the refresh counter in accordance with the first control pulse signal and outputting the latched value as the row address, and latching the external address acquired together with the write command or the read command in accordance with the second control pulse signal and outputting the latched value as the row address.

11. The device according to claim 10, wherein the refresh counter includes a plurality of counter portions connected to one another in series.

12. A method for testing a semiconductor memory device that acquires an external command, which includes a write command and a read command, and an external address in synchronism with a clock signal and automatically performs precharge after the read operation or the write operation, wherein the method comprises the steps of:

setting a test mode to perform a burn-in test in accordance with the external command;

generating a mode signal in accordance with the setting of the test mode;

performing either the read operation or the write operation;

generating an auto precharge signal in the device for automatically performing precharge after the read operation or the write operation is performed; and invalidating the auto precharge signal in accordance with the mode signal during the burn-in test.

13. The method according to claim 12 further comprising acquiring the external command and the external address simultaneously before setting the test mode.

14. A semiconductor memory device that acquires an external command, which includes a write command and a read command, and an external address simultaneously in synchronism with a clock signal and automatically performs precharge after the read operation or the write operation, wherein the device comprises:

a read/write control circuit for generating an auto precharge signal for a predetermined time after the read operation and write operation are performed;

a precharge control circuit for receiving the auto precharge signal and outputting a precharge signal; and a test mode setting circuit for providing a mode signal, which invalidates the auto precharge signal to the precharge control signal.

15. The device according to claim 14 further comprising a NOR circuit connected to the test mode setting circuit and the read/write control circuit, wherein the NOR circuit has a first input terminal which receives the mode signal, a second input terminal which receives the auto precharge signal, and an output terminal connected to the precharge control circuit.

* * * * *